United States Patent
Blaine

(10) Patent No.: US 9,800,041 B2
(45) Date of Patent: Oct. 24, 2017

(54) ELECTRICAL JUNCTION BOX

(71) Applicant: Ryan M. Blaine, Wichita, KS (US)

(72) Inventor: Ryan M. Blaine, Wichita, KS (US)

( * ) Notice: Subject to any disclaimer, the term of this patent is extended or adjusted under 35 U.S.C. 154(b) by 0 days.

(21) Appl. No.: 15/161,107

(22) Filed: May 20, 2016

(65) Prior Publication Data
US 2016/0268789 A1    Sep. 15, 2016

Related U.S. Application Data

(60) Provisional application No. 62/179,923, filed on May 22, 2015.

(51) Int. Cl.
*H02G 3/08* (2006.01)
*H02G 15/115* (2006.01)
*H05K 5/02* (2006.01)

(52) U.S. Cl.
CPC ............. *H02G 15/115* (2013.01); *H02G 3/08* (2013.01); *H02G 3/083* (2013.01); *H05K 5/0247* (2013.01)

(58) Field of Classification Search
USPC ........................................................ 174/500
See application file for complete search history.

(56) References Cited

U.S. PATENT DOCUMENTS

| | | |
|---|---|---|
| 2,324,791 A | 7/1943 | McLoughlin et al. |
| 3,531,071 A | 9/1970 | Kubli |
| 3,534,146 A | 10/1970 | Fell |
| 3,742,119 A | 6/1973 | Newman |
| 4,163,882 A | 8/1979 | Baslow |
| 4,890,318 A | 12/1989 | Crane et al. |
| 5,162,612 A | 11/1992 | Naka et al. |
| 5,280,132 A | 1/1994 | Clarey et al. |
| 5,610,370 A | 3/1997 | Fremgen et al. |
| 5,679,924 A | 10/1997 | Young et al. |
| 5,898,132 A | 4/1999 | Lee |
| 5,912,433 A * | 6/1999 | Pulido ................. H02G 15/013 174/74 R |
| 5,990,420 A | 11/1999 | Alexander |
| 6,069,315 A | 5/2000 | Tang |
| 6,930,246 B1 | 8/2005 | Blundo |
| 7,459,631 B2 | 12/2008 | Nakayama et al. |
| 7,806,374 B1 | 10/2010 | Ehmann et al. |
| 8,772,642 B2 | 7/2014 | Ehmann |
| 9,093,826 B2 | 7/2015 | Zimmerer |
| 2004/0188122 A1 | 9/2004 | Takeuchi et al. |

FOREIGN PATENT DOCUMENTS

WO    WO99/06747    2/1999

* cited by examiner

*Primary Examiner* — Dhirubhai R Patel
(74) *Attorney, Agent, or Firm* — Kenneth H. Jack; Davis & Jack, L.L.C.

(57) ABSTRACT

An electrical junction box including a rear wall and lateral and oppositely lateral walls extending forwardly from the rear wall; a plate series spanning between the lateral and oppositely lateral walls; a plurality of first tongue and groove joints interconnecting the lateral ends of the plates; and at least a first cable passage port extending from the upper surface of one of the plates to the one plate's lower surface.

16 Claims, 4 Drawing Sheets

ELECTRICAL JUNCTION BOX

This non-provisional patent application claims the benefit of and priority from U.S. provisional patent application No. 62/179,923 filed May 22, 2015. The inventor disclosed in and applicant of said provisional application is the same person as the person who is disclosed as the inventor and applicant of the instant application. The applicant asserts that structures and functions of structures disclosed and described in the instant application are substantially identical to those disclosed in said provisional application.

FIELD OF THE INVENTION

This invention relates to electrical components and hardware. More particularly, this invention relates to wall mounted electric junction boxes such as electric circuit breaker boxes.

BACKGROUND OF THE INVENTION

Conventional household and commercial building electrical junction boxes typically include fixed upper and lower or vertical and oppositely vertical walls which include pluralities of circular cable passage ports. In many circumstances, an electrician's working access to areas above and below an installed electrical junction box is limited by structures such as upper and lower edges of a box recessing access port within a sheetrock wall panel. Electrical cables residing within wall spaces above and/or below such electrical junction box may be required to be threaded downwardly and upwardly through the box's cable ports. Access restrictions imposed by such sheetrock panel complicates the task of threading cables through the cable ports. Where the cable ports define the electrician's working space, cables are difficult to grasp, downwardly pull, and downwardly thread through the ports.

The instant inventive electrical junction box solves or ameliorates the difficulties described above by specially configuring an electrical junction box's vertical and/or oppositely vertical walls to include a series of laterally interconnecting plates.

BRIEF SUMMARY OF THE INVENTION

The instant inventive electrical junction box conventionally includes rear and lateral or left and right walls.

A further structural component of the instant inventive electrical junction box comprises at least a first plate series which spans laterally between the box's lateral and oppositely lateral walls.

Further structural components of the instant inventive electrical junction box comprise a lateral series or plurality of plate side tongue and groove joints. At least a first, and preferably a plurality of cable passage port extend through at least one of the plates.

The forward end of the plate series is preferably supported by cantilevering left and right support arms, and the rearward end of the plate series is preferably supported by rearward tongue and groove joints.

Where, for example, the invention's plate series component is to be installed at the vertical end of the junction box, all of the plates among the series may be initially removed. Thereafter, overlying electrical cables may be downwardly extended into the interior of the junction box, such downward extension advantageously being initially unobstructed by any box ceiling or floor structure. Thereafter, the plates of the plate series may be successively interconnected laterally across the lateral span of the box, with cables being easily and conveniently threaded through the plates' cable ports substantially contemporaneously with such assembly.

Accordingly, objects of the instant invention include the provision of an electrical junction box which incorporates structures as described above, and which configures those structures in relation to each other in manners described above for the achievement of beneficial functions described above.

Other and further objects, benefits, and advantages of the instant invention will become known to those skilled in the art upon review of the Detailed Description which follows, and upon review of the appended drawings.

DETAILED DESCRIPTION OF A PREFERRED EMBODIMENT

Figure 1:
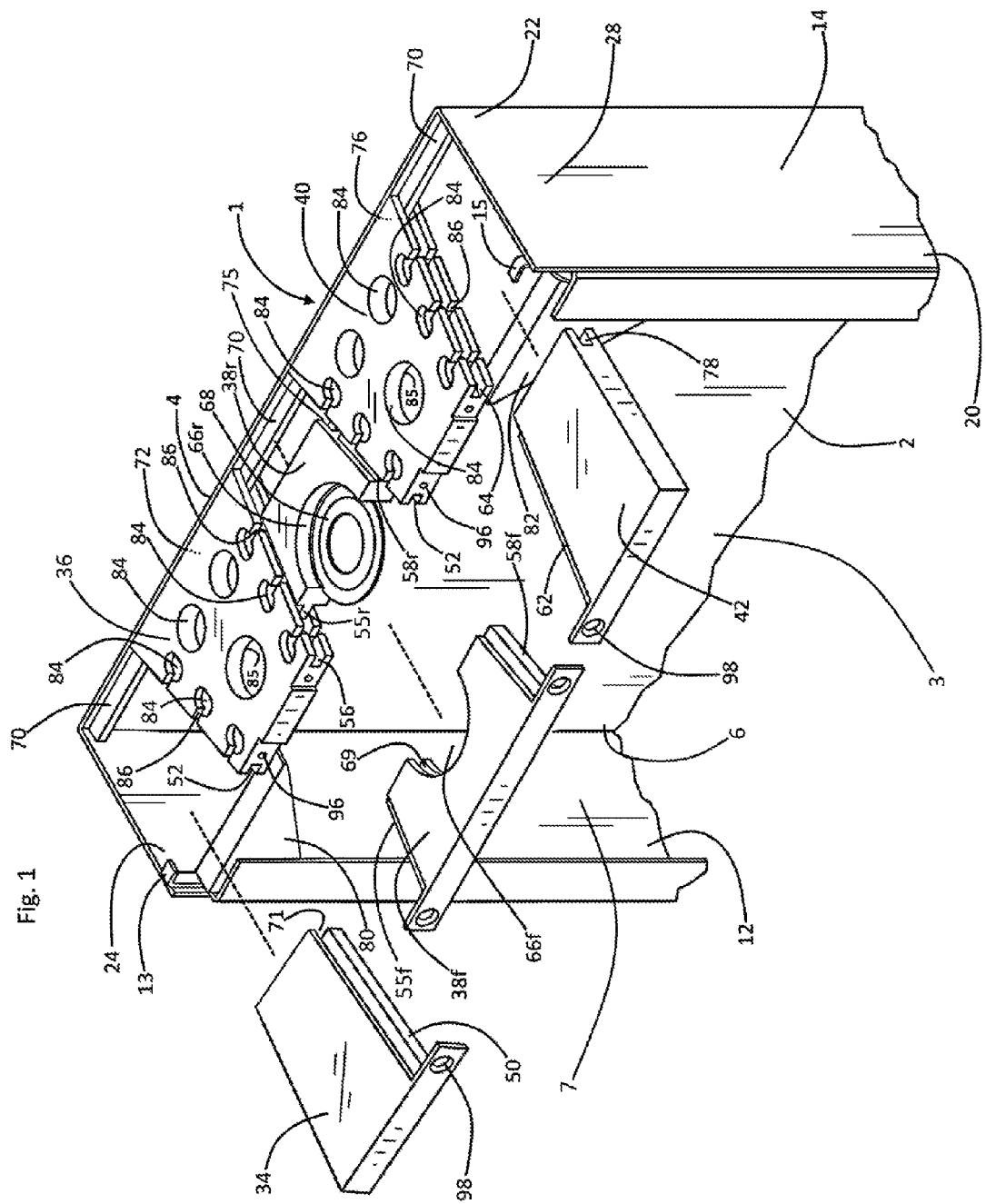
FIG. 1 is a perspective and partially exploded view of a vertical end of the instant inventive electrical junction box.

Referring now to the drawings and in particular to Drawing FIG. 1, a preferred embodiment of the instant inventive electrical junction box is referred to generally by Reference Arrow 1. The box 1 has a rectangular back wall 2, having a vertical end 4, and having, referring further simultaneously to FIG. 4, an oppositely vertical end 5, the back wall 2 further having lateral and oppositely lateral ends 6 and 10. The box 1 preferably further comprises lateral and oppositely lateral walls 12 and 14, such walls having vertical and oppositely vertical ends 24 and 26, and 28 and 30, such walls having front and rear ends 16 and 18, and 20 and 22. In the preferred embodiment, the lateral walls 12 and 14 are fixedly attached to or formed wholly with the lateral and oppositely lateral ends 6 and 10 of the back wall 2, such walls extending forwardly and substantially perpendicularly.

Referring to FIG. 1, the instant inventive electrical junction box 1 preferably further comprises at least a first plate series which spans laterally between the lateral and oppositely lateral walls 12 and 14, such series being represented by plates 34, 36, 38f, 38r, 40, and 42. Fewer and greater numbers of such plates are considered to fall within the scope of the invention.

Figure 2:
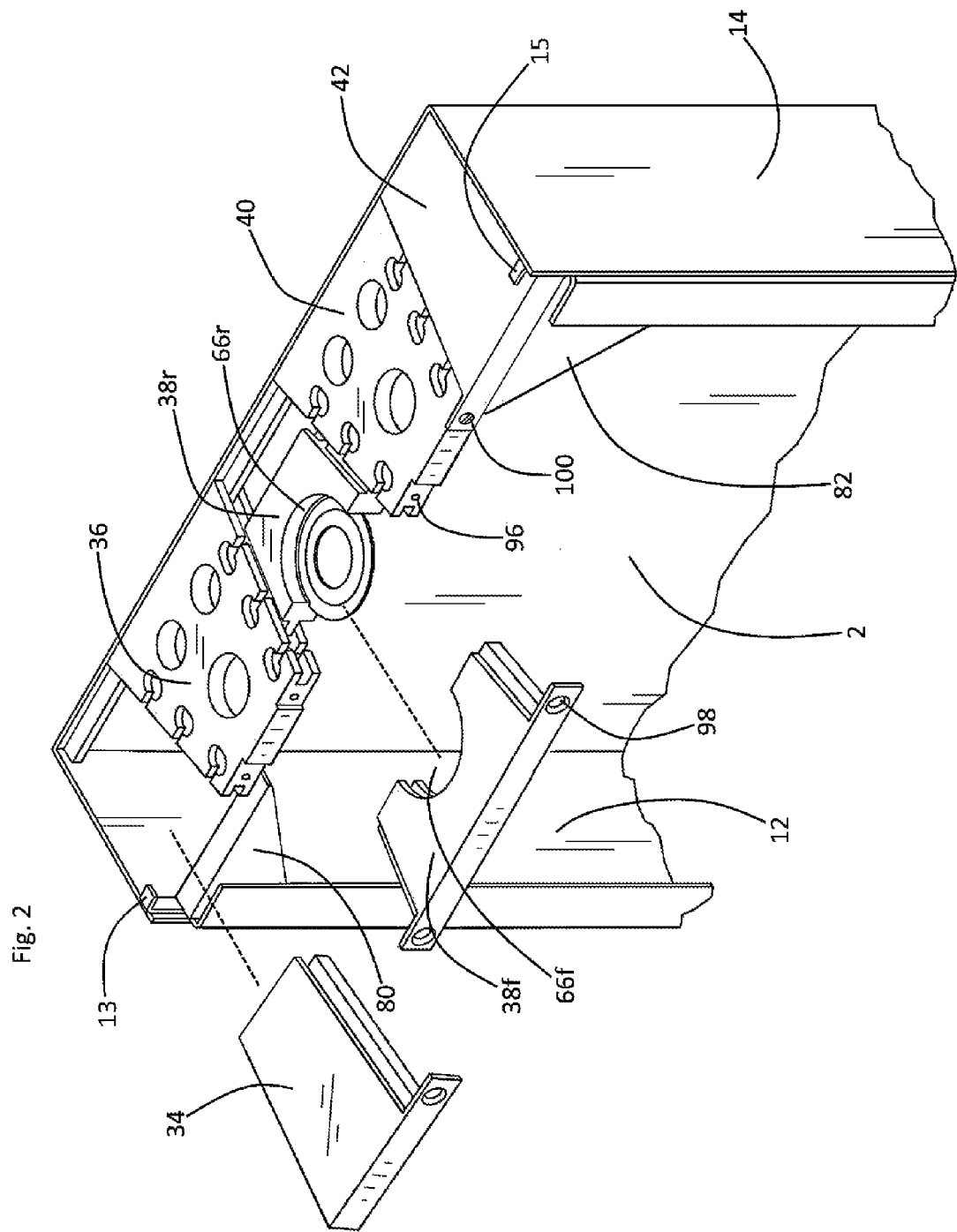
FIG. 2 redepicts the structure of FIG. 1, the view of FIG. 2 showing the invention's lateral-most plate installed.
Figure 3:
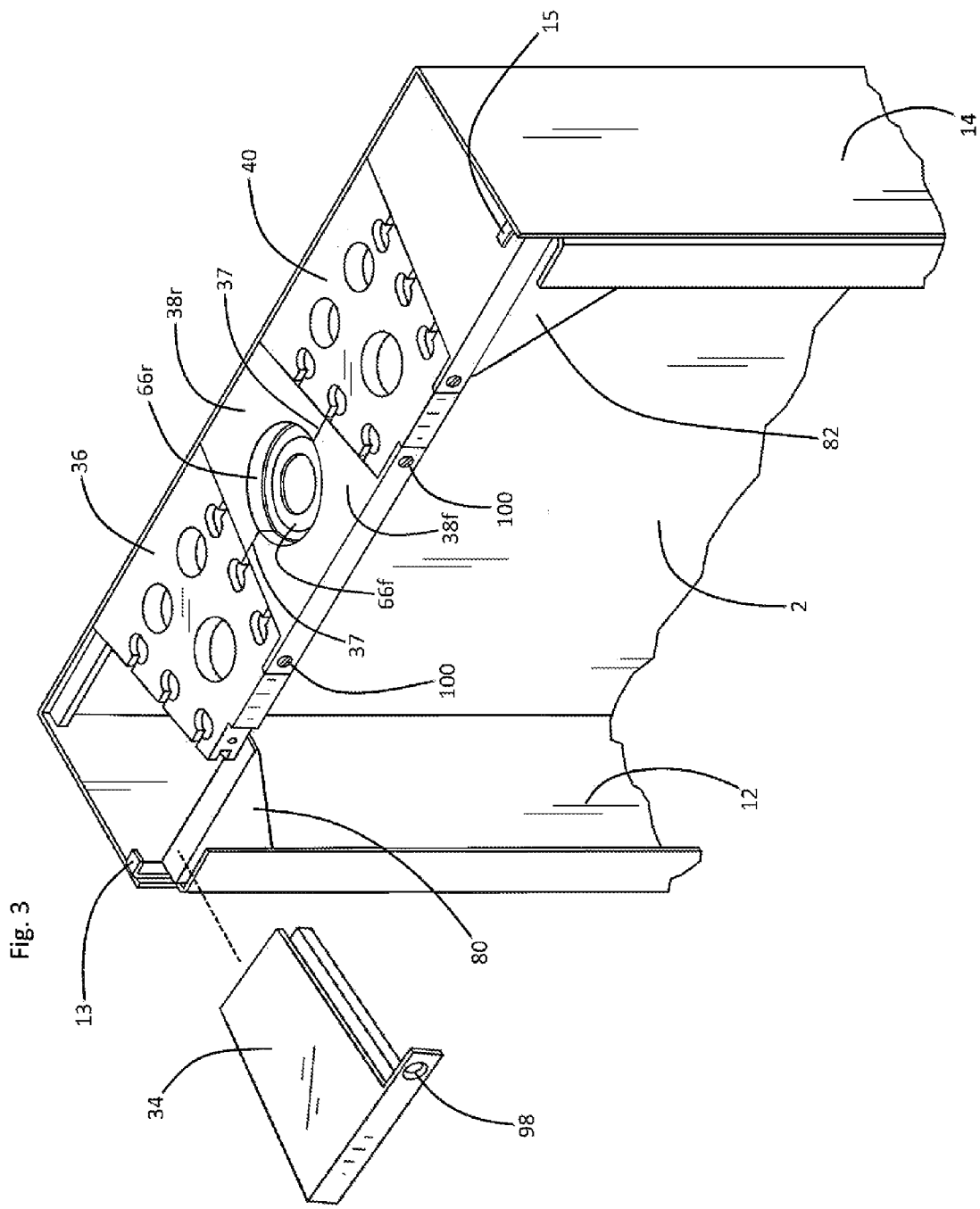
FIG. 3 redepicts the structure of FIG. 2, the view of FIG. 3 further showing the invention's at least first medial plate installed.

Further structural components of the instant inventive electrical junction box comprise a plurality of plate side tongue and groove joints. In Drawing FIG. 1, such plurality of tongue and groove joints is represented by the combinations of tongue 50 and groove 52, co-linear tongues 55f and 55r and groove 56, co-linear tongues 58f and 58r, and groove 52, and tongue 62 and groove 64. Upon progressive assembly of the plates 34, 36, 38f, 38r, 40, and 42, as depicted in FIGS. 1-3, each of such plate side tongue and groove joints becomes positioned both at a plate lateral end (e.g., the positioning of tongue and groove joint 50,52 at the lateral end of plate 36) and at the oppositely lateral end of another or next adjacent plate (e.g., the positioning of tongue and groove joint 50,52 at the oppositely lateral end of plate 34).

In a preferred embodiment, the plates' tongues 50, 55f, 55r, 58f, 58r, and 62 have extended lateral or oppositely lateral heights sufficient for, upon the plates' lateral interconnections, allowing the lateral and oppositely lateral faces of such tongues to protrude into the inner bores of adjacent cable passage ports 84. Such inward tongue protrusions may advantageously compress against wire cables (not within views) extending vertically through such ports 84. Accordingly, such tongues, in combination with opposing walls of such ports 84, my additionally or dually function as cable securing clamp jaws.

A further structural component of the instant inventive electrical junction box comprises at least a first cable passage port which passes through one of the plates from the plate's upper surface to the plate's lower surface. An example of such at least first cable passage port is the central cable passage port 84 which extends from the upper surface of plate 40 to such plate's lower surface 85). As indicated in FIG. 1, a plurality of such ports 84 are preferably provided.

In use of the instant inventive electrical junction box 1, each of the series' plates 34, 36, 38f, 38r, 40, and 42 may be initially removed. Thereafter, electrical cables (not depicted within views) which may overlie the electrical junction box 1 may be easily and conveniently directed downwardly through the exposed upper opening of the case to extend into the case's interior space 3. Thereafter, the plate series may be assembled in a lateral or oppositely lateral sequence across the lateral span of the box. During the plate series assembly, selected electrical cables may be contemporaneously inserted into or threaded through conveniently aligned ports 84. Referring further to FIG. 1, plates 34 and 42 respectively comprise lateral-most and oppositely lateral-most plates, and plates 38f, 38r comprise, upon assembly, an at least a first medial plate. As indicated in FIG. 3, such plate at least first medial plate 38f, 38r is preferably trapezoidally configured.

Plates 36 and 40 comprise a plurality of second medial plates residing between the lateral-most and oppositely lateral-most plates 34 and 42, such second medial plates 36 and 40, like the at least first medial plate 38f and 38r, are preferably trapezoidally configured. For ease of assembly and interchangeability of plates, the at least first and second medial plates 38f, 38r, 36, and 40 are preferably further configured so that their horizontal peripheries substantially form isosceles trapezoids. To accommodate the preferred perpendicular extensions of the lateral and oppositely lateral walls 12 and 14, the lateral-most and oppositely lateral-most plates 34 and 42 have horizontal peripheries which form mirroring trapeziums.

Referring simultaneously to FIGS. 1 and 3, the front and rear medial plates 38f and 38r are themselves preferably isosceles trapezoid shaped, such plates meet at a laterally extending seam 37. Where the number of the instant inventive box's cable passage ports is limited to the at least first cable passage port, such port is preferably formed by half sections 66f and 66r within the at least first medial plate 38f, 38r, and seam 37 preferably laterally bisects such port. To enable such at least first cable passage port 66f, 66r to be closely fitted for receipts of variously sized cable bundles, frangible "knock out" ring plates or discs 68 may be wholly formed with plate 38r. Such ring plates 38 preferably securely nest in "tongue and groove" joint fashion within a semi-circular groove 69 within plate 38f.

Means for securely supporting the plate series 34, 36, 38f, 38r, 40, and 42 at their rearward ends are provided, such means preferably comprising a laterally extending series of rear tongue and groove joints. In the example of Drawing FIG. 1, such lateral series is represented by tongue 70 and groove 71, tongue 70, and groove 72, tongue 70 and groove 75, tongue 70 and groove 76, and tongue 70 and groove 78. Suitably, the tongues and grooves of such lateral series may be alternatively reversed front to rear.

Forward or front end support of the plate series 34, 36, 38f, 38r, 40, and 42, preferably comprises lateral and oppositely lateral arms 80 and 82 whose proximal ends are respectively fixedly attached at the forward ends 16 and 20 of the lateral and oppositely lateral walls 12 and 14. Such arms 80 and 82 preferably cantilever in order to leave a wide forward passage space between their distal ends, such forward passage space facilitating insertions of equipment, components, and cabling into the case's interior 3. The arms 80 and 82 respectively support at least the front ends of the lateral-most and oppositely lateral-most plates 34 and 42, while the angled trapezoidal configurations of the plates 36, 38f, 38r, and 40 which span between the distal ends of such arms advantageously resist downward deflections of such plates' front ends. Lateral and oppositely lateral edge hooks 13 and 15 are preferably provided for resisting upward displacements of the front ends of plates 34 and 42. Alignable eye and screw fastener combinations 96, 98, and 100 are also preferably provided for further securing the plates 34, 36, 38f, 38r, 40, and 42 in their laterally aligned orientations.

Referring further to FIG. 1, the instant inventive electrical junction box further comprises a plurality of cable passage slots 86, each such slot preferably extending from one of the second cable passage ports 84 to a lateral or oppositely lateral end of one of the plates. For example, at the lateral end of plate 36, a cable passage slot 86 extends laterally from one of the second cable passage ports 84. Alternatively, at the oppositely lateral end of plate 40, another cable passage slot 86 extends oppositely laterally from another second passage port 84. Similarly, with the function of the segmented cable passage port 66f, 66r, the cable passage slots 86 advantageously allow wires and cables to be received within a port without the necessity of accessing cable ends for aperture threading. In the preferred embodiment, each cable passage slot 86 configures one of the second cable passage ports as a keyhole slot.

Figure 4:
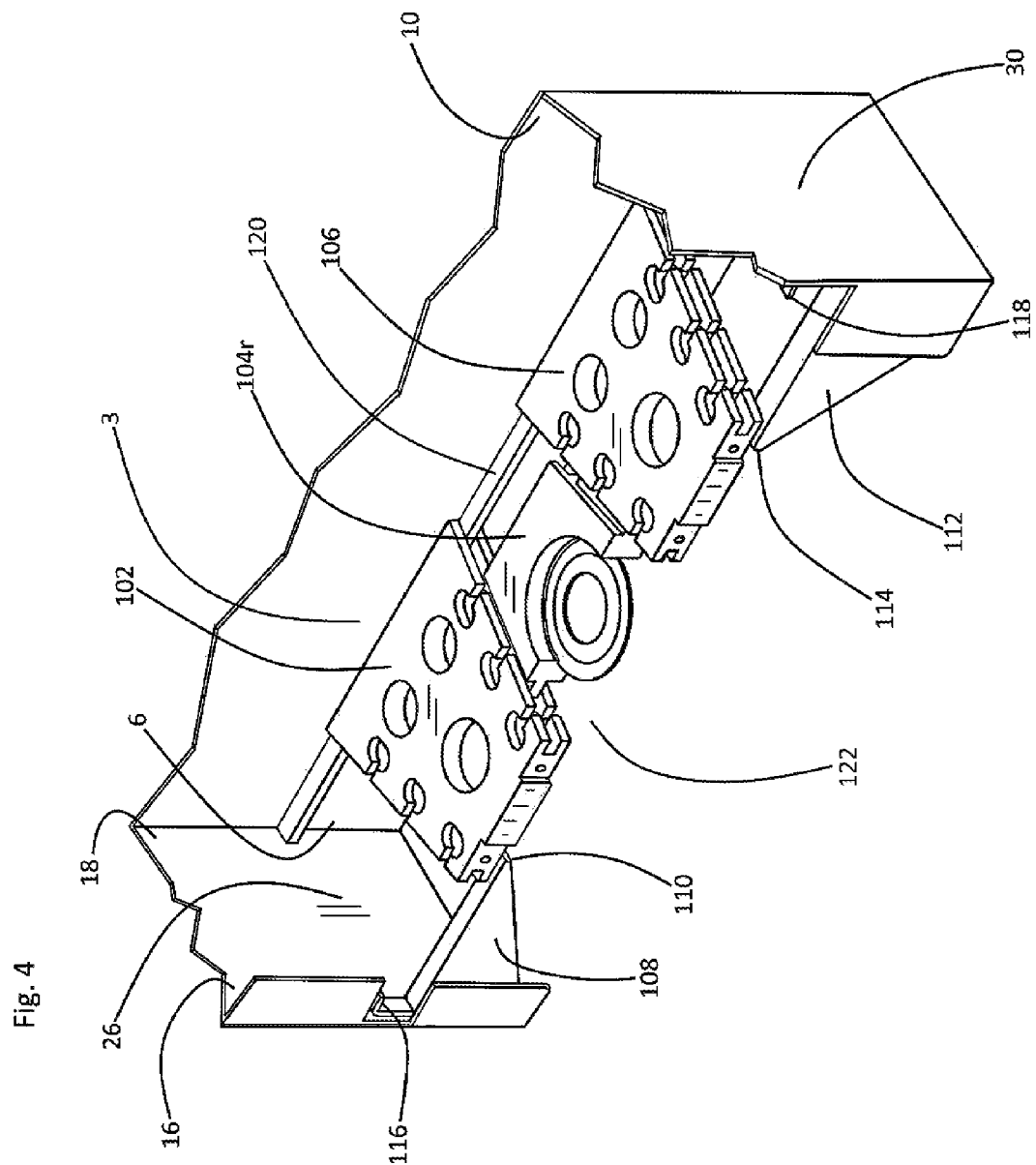
FIG. 4 depicts an oppositely vertical end of the instant inventive electrical junction box.

Referring simultaneously to FIGS. 1 and 4, a second plate series represented by plates 102, 104r, and 106 may be provided. Such second plate series, like the at least first plate series of FIGS. 1-3, spans laterally between the lateral and oppositely lateral walls 12 and 14. The front and rear ends of the second plate series are supported similarly with those of the at least first plate series, the rearward ends supported by a laterally extending groove 120, and with the forward ends supported by cantilevering arms 108 and 112 having distal ends 110 and 114. Lateral and oppositely lateral retainer hooks 116 and 118. Similarly, with the function of the overlying arms 80 and 82, the arms 108 and 112 secure plate front ends against upward displacements. The distal ends 110 and 114 of arms 108 and 112 advantageously form and define an open forward passage 122 which, like arms 80 and 82, facilitate unobstructed insertions of cabling and other electrical components into the case's interior space 3.

Upon the provision of the second plate series of FIG. 4, forward ends of the two plate series in combination with the forward ends of the lateral and oppositely lateral walls 12 and 14 advantageously bound and define a forward junction box opening 7.

While the principles of the invention have been made clear in the above illustrative embodiment, those skilled in the art may make modifications to the structure, arrangement, portions and components of the invention without departing from those principles. Accordingly, it is intended that the description and drawings be interpreted as illustrative and not in the limiting sense, and that the invention be given a scope at least commensurate with the appended claims.

The invention hereby claimed is:

1. An electrical junction box comprising:
   (a) a rear wall;
   (b) lateral and oppositely lateral walls respectively extending forwardly from lateral and oppositely lateral ends of the rear wall;
   (c) at least a first plurality of plates arranged in a series spanning between the lateral and oppositely lateral walls, each plate having upper and lower surfaces, front and rear ends, and lateral and oppositely lateral ends;
   (d) a plurality of side tongue and groove joints, each joint among the plurality of side tongue and groove joints being positioned at a plate lateral end, said each joint being further positioned at a plate oppositely lateral end, said each joint being fixedly attached to or formed wholly with an adjacent pair of plates among the first plurality of plates; and
   (e) at least a first cable passage port extending from the upper surface of one of the plates among the at least first plate series to said one plate's lower surface.

2. The electrical junction box of claim 1 wherein the plate series comprises a lateral-most plate, an oppositely lateral-most plate, and at least a first medial plate, the at least first medial plate being trapezoidally configured.

3. The electrical junction box of claim 2 further comprising a plurality of second medial plates, each plate among the plurality of second medial plates being trapezoidally configured.

4. The electrical junction box of claim 3 wherein each plate among the at least first and plurality of second medial plates is further isosceles configured.

5. The electrical junction box of claim 4 wherein the lateral-most and oppositely lateral-most plates are trapezium configured.

6. The electrical junction box of claim 1 wherein the one of the plates among the at least first plate series comprises front and rear segments meeting at a lateral seam, the lateral seam bisecting the at least first cable passage port.

7. The electrical junction box of claim 6 wherein each segment among the one of the plates' front and rear segments is trapezoidally configured.

8. The electrical junction box of claim 7 wherein each segment among the one of the plates' front and rear segments is further isosceles configured.

9. The electrical junction box of claim 8 wherein the plate series comprises a lateral-most plate, an oppositely lateral-most plate, and at least a first medial plate, the one of the plates comprising the at least first medial plate.

10. The electrical junction box of claim 6 further comprising a plurality of rear tongue and groove joints supporting the plates' rearward ends.

11. The electrical junction box of claim 10 wherein the at least first plurality of plates comprises a lateral-most plate and an oppositely lateral-most plate, and further comprising lateral and oppositely lateral arms respectively cantilevering oppositely laterally and laterally from front ends of the lateral and oppositely lateral walls, the lateral arm at least supporting the front end of the lateral-most plate, and the oppositely lateral arm at least supporting the front end of the oppositely lateral-most plate.

12. The electrical junction box of claim 11 wherein the lateral and oppositely lateral arms have distal ends, and further comprising a forward passage having laterally and oppositely ends bounded by said arms' distal ends.

13. The electrical junction box of claim 1 further comprising a plurality of second cable passage ports, each port among the plurality of second cable passage ports extending from the upper surface of another one of the plates among the at least first plurality of plates to the lower surface of said another plate.

14. The electrical junction box of claim 13 further comprising a plurality of cable passage slots, each slot among the plurality of cable passage slots extending from one of the second cable passage ports to one of the plate ends among the plates' lateral and oppositely lateral ends.

15. The electrical junction box of claim 14 wherein each cable passage slot keyhole configures one of the second cable passage ports.

16. The electrical junction box of claim 1 comprising a second plurality of plates arranged in a second series spanning between the lateral and oppositely lateral walls, said walls and the at least first and second pluralities of plates bounding a forward junction box opening.

* * * * *